United States Patent
Natori

(10) Patent No.: US 6,707,716 B2
(45) Date of Patent: Mar. 16, 2004

(54) NON-VOLATILE SEMICONDUCTOR MEMORY DEVICE

(75) Inventor: Kanji Natori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/323,921

(22) Filed: Dec. 20, 2002

(65) Prior Publication Data

US 2003/0137875 A1 Jul. 24, 2003

(30) Foreign Application Priority Data

Jan. 10, 2002 (JP) ........................................ 2002-003402

(51) Int. Cl.⁷ .............................................. G11C 16/04
(52) U.S. Cl. ............................ 365/185.18; 365/185.21; 365/189.11
(58) Field of Search ....................... 365/185.18, 189.11, 365/185.21; 327/536

(56) References Cited

U.S. PATENT DOCUMENTS

| | | | |
|---|---|---|---|
| 5,408,115 A | 4/1995 | Chang | |
| 5,422,504 A | 6/1995 | Chang et al. | |
| 5,494,838 A | 2/1996 | Chang et al. | |
| 5,969,383 A | 10/1999 | Chang et al. | |
| 5,986,935 A | * 11/1999 | Iyama et al. | ............ 365/185.18 |
| 6,177,318 B1 | 1/2001 | Ogura et al. | |
| 6,248,633 B1 | 6/2001 | Ogura et al. | |
| 6,255,166 B1 | 7/2001 | Ogura et al. | |
| 6,424,585 B1 * | 7/2002 | Ooishi | ......................... 365/226 |
| 2002/0003724 A1 * | 1/2002 | Tanzawa et al. | ........ 365/189.11 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 09/955,158, Kanai et al., filed Sep. 19, 2001.
U.S. patent application Ser. No. 09/955,160, Kanai et al., filed Sep. 19, 2001.
U.S. patent application Ser. No. 10/115,913, Kamei, filed Apr. 5, 2002.

(List continued on next page.)

Primary Examiner—Huan Hoang
(74) Attorney, Agent, or Firm—Oliff & Berridge, PLC

(57) ABSTRACT

In a non-volatile semiconductor memory device of the present invention, a level sense circuit controls operation of an oscillation circuit to make an output voltage of a charge pump circuit equal to a setting voltage. The level sense circuit detects a change of the output voltage of the charge pump circuit to a second setting voltage, which corresponds to a second operation mode and is set by a control circuit, after a switchover from a first operation mode to the second operation mode controlled by the control circuit. This results in detection of an end timing of operation of a discharge circuit, which is driven at the time of the switchover from the first operation mode to the second operation mode. The control circuit stops the operation of the discharge circuit, based on a result of detection of the end timing. This arrangement of the present invention effectively shortens a time period required for enabling an access at the time of the switchover of the operation mode without significantly increasing the total space of the non-volatile semiconductor memory device.

4 Claims, 11 Drawing Sheets

OTHER PUBLICATIONS

U.S. patent application Ser. No. 10/115,956, Kamei, filed Apr. 5, 2002.
U.S. patent application Ser. No. 10/153,611, Owa, filed May 24, 2002.
U.S. patent application Ser. No. 10/153,686, Owa, filed May 24, 2002.
U.S. patent application Ser. No. 10/153,736, Owa, filed May 24, 2002.
U.S. patent application Ser. No. 10/157,896, Kamei et al., filed May 31, 2002.
U.S. patent application Ser. No. 10/157,897, Kamei et al., filed May 31, 2002.
U.S. patent application Ser. No. 10/193,066, Kanai, filed Jul. 12, 2002.
U.S. patent application Ser. No. 10/193,602, Kanai, filed Jul. 12, 2002.
U.S. patent application Ser. No. 10/197,643, Kanai et al., filed Jul. 18, 2002.
U.S. patent application Ser. No. 10/197,644, Kamei, filed Jul. 18, 2002.
U.S. patent application Ser. No. 10/197,645, Natori, filed Jul. 18, 2002.
U.S. patent application Ser. No. 10/197,646, Kanai, filed Jul. 18, 2002.
U.S. patent application Ser. No. 10/197,668, Kanai, filed Jul. 18, 2002.
U.S. patent application Ser. No. 10/229,064, Kamei, filed Aug. 28, 2002.
U.S. patent application Ser. No. 10/246,486, Natori, filed Sep. 19, 2002.
U.S. patent application Ser. No. 10/246,665, Natori, filed Sep. 19, 2002.
U.S. patent application Ser. No. 10/246,708, Natori, filed Sep. 19, 2002.
U.S. patent application Ser. No. 10/246,727, Natori, filed Sep. 19, 2002.
U.S. patent application Ser. No. 10/338,833, Natori, filed Jan. 9, 2003.
U.S. patent application Ser. No. 10/338,834, Natori, filed Jan. 9, 2003.
Hayashi et al., "Twin MONOS Cell with Dual Control Gates", 2000 IEEE VLSI Technology Digest of Technical Papers.
Chang et al., "A New SONOS Memory Using Source–Side Injection for Programming", IEEE Electron Device Letters, vol. 19, No. 7, Jul. 1998, pp. 253–255.
Chen et al., "A Novel Flash Memory Device with S Plit Gate Source Side Injection and ONO Charge Storage Stack (SPIN)", 1997, VLSI Technology Digest, pp. 63–64.

* cited by examiner

Fig.3

| Mode | BS | Selected Twin MONOS Cell | | | | | Non-Selected Twin MONOS Cell | | |
|---|---|---|---|---|---|---|---|---|---|
| | | WL | Selected Memory Element | | Opposite Memory Element | | WL | BL | SCG |
| | | | BL | SCG | BL | SCG | | | |
| Read | 4.5V Facing Side Vdd Selected Side | Vdd | 0V | 1.5V±0.1V | sense | 3V | Vdd or 0V | sense or 0V | 3V or 1.5V±0.1V or 0V |
| Program | 8V | About 1V | 5V | 5.5V | Iprg=5uA (0 to 1V) | 2.5V | About 1V or 0V | 5V or Vdd or(0 to 1V) | 5.5V or 2.5V or 0V |
| Erase | 8V | 0V | 4.5 to 5V | −1 to −3V | 4.5 to 5V | −1 to −3V | | | |

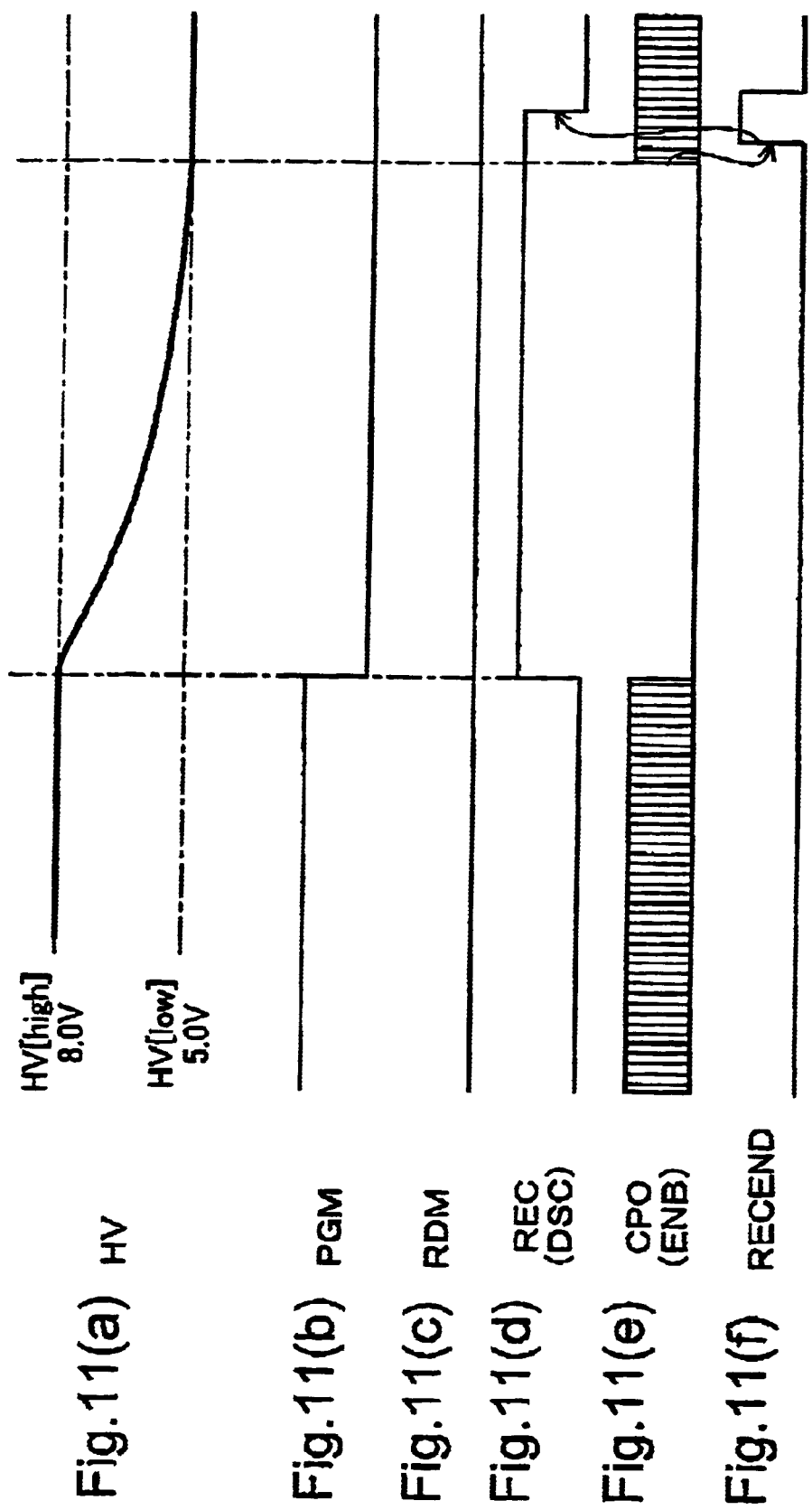

NON-VOLATILE SEMICONDUCTOR MEMORY DEVICE

BACKGROUND OF THE INVENTION

1. Field of the Invention

The present invention relates to a non-volatile semiconductor memory device, and more specifically to a non-volatile semiconductor memory device with a charge pump for boosting a power source voltage.

2. Description of the Related Art

Semiconductor memory devices are classified into multiple groups according to their functions. The semiconductor memory device has a memory cell array, in which multiple memory cells are arranged in a matrix. Data reading, programming or writing, and erasing operations with regard to each memory cell are generally carried out by specifying an address in a row direction and a column direction of the memory cell array.

Regulation of a voltage applied to a signal line in the row direction and to a signal line in the column direction connected to each memory cell enables an access to the memory cell, in order to carry out a predetermined operation out of the data reading, programming, and erasing operations. For selection of a certain memory cell, a specific voltage, which is different from a voltage applied to the other memory cells, is generated from a power source voltage and is applied to the certain memory cell.

Recently developed MONOS (Metal Oxide Nitride Oxide Semiconductor or Substrate)-type non-volatile semiconductor memory devices are non-volatile and enable electrical erasing of data. In the MONOS-type non-volatile semiconductor memory device, each memory cell has two memory elements as discussed in a reference Y. Hayashi, et al., 2000 Symposium on VLSI Technology Digest of Technical Papers, pp. 122–123.

As described in this cited reference, in order to gain access to the respective memory elements in such a MONOS-type non-volatile semiconductor memory device, it is required to set a plurality of different voltages corresponding to the respective signal lines (control lines), which depend upon the number of the memory cells. Different setting voltages are also required corresponding to the respective operations (reading, programming, and erasing operations) of the memory cell.

For this purpose, multiple sets of a booster circuit, which includes a charge pump circuit driven by the power source voltage, and a regulator should be provided corresponding to the multiple setting voltages required for the respective operations of the memory cell.

The multiple sets of the booster circuit and the regulator corresponding to the multiple setting voltages required for the respective operations of the memory cell undesirably occupies a large space.

One proposed technique switches over the voltage generated by the booster circuit and the voltage generated by the regulator according to each operation mode of the memory cell.

There are a capacitor for voltage accumulation and parasitic capacitors on the output side of the booster circuit. This slows down the response of a switchover of the voltage generated by the booster circuit according to each operation of the memory cell. Especially in the case of a change from a relatively high voltage to a relatively low voltage, for example, in the case of a change from the data programming mode to the data reading mode, the operation of the charge pump circuit is stopped. Discharge of electric charges accumulated in the capacitor accordingly takes a long time. A long time period is thus required for enabling an access to the memory cell and implementing the data reading operation.

This problem is solved by newly providing a discharge circuit and a detection sensor that detects an end timing of the discharge operation. Addition of the discharge circuit and the detection sensor, however, undesirably increases the total space of the non-volatile semiconductor memory device.

SUMMARY OF THE INVENTION

The advantage of the present invention is thus to provide a non-volatile semiconductor memory device that shortens a time period required for enabling an access at the time of a switchover of an operation mode without significantly increasing the total space of the non-volatile semiconductor memory device.

In order to attain at least part of the above and the other related objects, the present invention is directed to a non-volatile semiconductor memory device having a memory cell array of multiple non-volatile memory elements. The non-volatile semiconductor memory device includes: a booster circuit that generates a boosted voltage from a power source voltage according to each of diverse operation modes in the non-volatile semiconductor memory device; a working voltage generation circuit that generates a working voltage to make a predetermined non-volatile memory element in the memory cell array carry out an operation according to each of the diverse operation modes; and a control circuit that controls operations of at least the working voltage generation circuit and the booster circuit according to each of the diverse operation modes.

The booster circuit has: a charge pump circuit that boosts the power source voltage and generates a boosted output voltage; an oscillation circuit that outputs a clock signal to control operation of the charge pump circuit; a level sense circuit that is set a relatively high first setting voltage in a first operation mode out of the diverse operation modes and a relatively low second setting voltage in a second operation mode by the control circuit, and controls operation of the oscillation circuit to make the output voltage of the charge pump circuit equal to the setting voltage; and a discharge circuit that is driven at a time of switchover from the first operation mode to the second operation mode to lower the level of the output voltage of the charge pump circuit. The level sense circuit detects a change of the output voltage of the charge pump circuit to the second setting voltage after the switchover from the first operation mode to the second operation mode, so as to detect an end timing of the operation of the discharge circuit. The control circuit stops the operation of the discharge circuit based on a result of detection of the end timing.

In the non-volatile semiconductor memory device of the present invention, the end timing of the operation of the discharge circuit is detected by the level sense circuit included in the booster circuit. This arrangement effectively shortens the time period required for enabling an access at the time of a switchover of an operation mode without significantly increasing the total space of the non-volatile semiconductor memory device.

In one preferable application, each of the non-volatile memory elements is a twin memory cell controlled by one word gate and two control gates.

This arrangement enables the memory cell array of twin memory cells to work in multiple operation modes, for example, in a data reading mode, in a data programming mode, and a in data erasing mode.

In another preferable application, each of the non-volatile memory elements has an ONO membrane including an oxide film (O), a nitride film (N), and an oxide film (O) as a trap side of electric charges.

This arrangement enables setting of a working voltage in a device using non-volatile MONOS memory cells.

The above and other objects, features, aspects, and advantages of the present invention will become more apparent from the following detailed description of the preferred embodiment with the accompanying drawings.

BRIEF DESCRIPTION OF THE DRAWINGS

FIG. 3 shows setting voltages in a data reading process from a memory element, in a data writing process into the memory element, and in a data erasing process from the memory element;

FIGS. 11(a) through 11(f) are a timing chart showing a switchover operation of an output voltage HV.

DESCRIPTION OF THE PREFERRED EMBODIMENT

A non-volatile semiconductor memory device in one embodiment of the present invention is discussed below with reference to the drawings.

A. Construction of Non-volatile Semiconductor Memory Device

Figure 1:
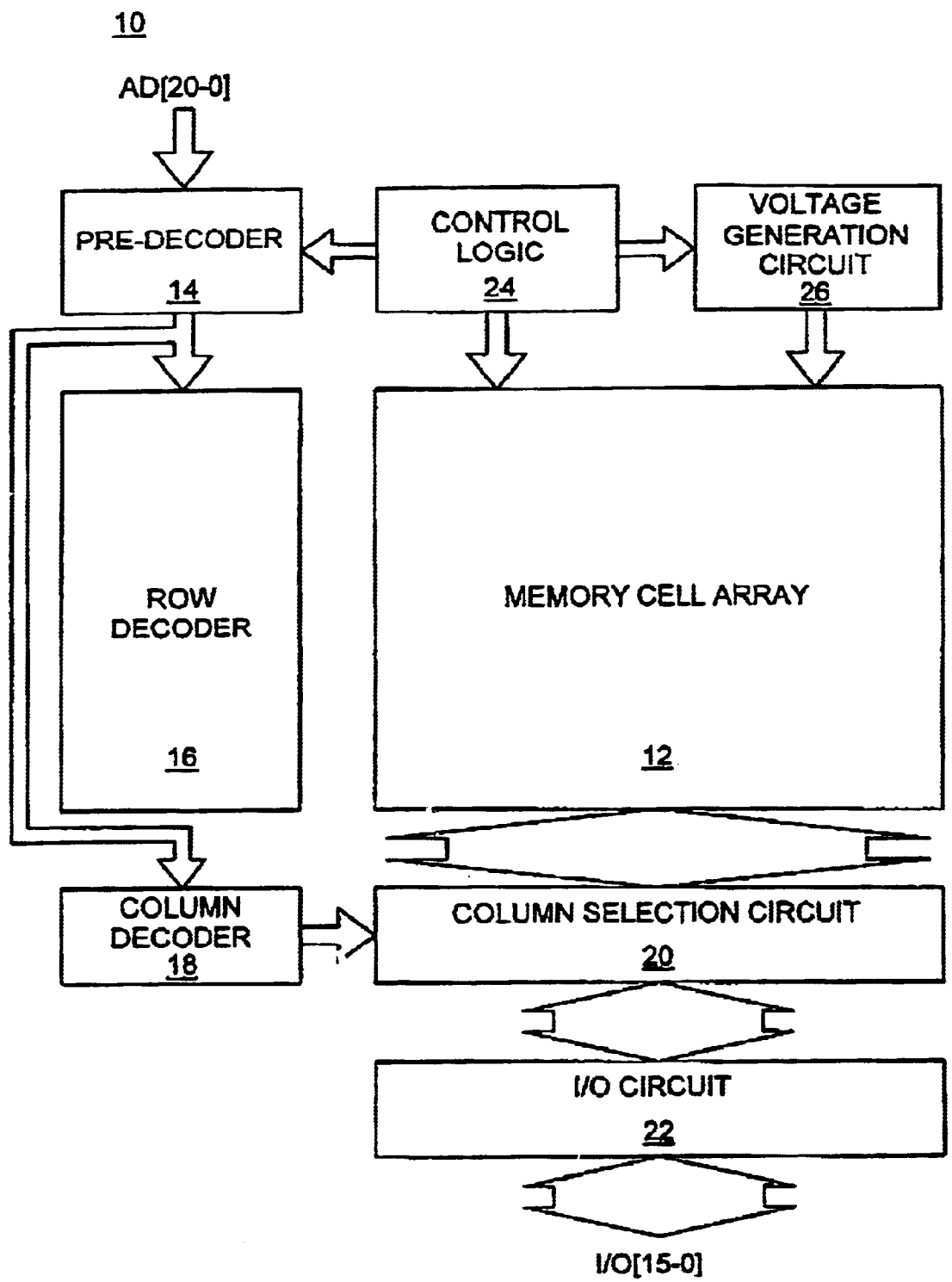
FIG. 1 is a block diagram schematically illustrating the general construction of a non-volatile semiconductor memory device in one embodiment of the present invention.

FIG. 1 is a block diagram schematically illustrating the general construction of a non-volatile semiconductor memory device 10 in one embodiment of the present invention. The non-volatile semiconductor memory device 10 includes a memory cell array 12, a pre-decoder 14, a row decoder 16, a column decoder 18, a column selection circuit 20, an I/O circuit 22, a control logic 24, and a voltage generation circuit 26. The non-volatile semiconductor memory device 10 also has a diversity of other circuits (not shown) including an address buffer, an input-output buffer, a control buffer, and a sense amplifier. But these circuit elements are not characteristic of the embodiment and are thus omitted from the illustration.

The pre-decoder 14, the row decoder 16, and the column decoder 18 function to decode an address signal, which specifies a selected non-volatile memory element (selected memory element) included in the memory cell array 12. In the example of FIG. 1, a 21bit address signal AD[20–0] is input into the pre-decoder 14.

The column selection circuit 20 selects a bit line corresponding to a selected cell specified by the column decoder 18 and connects the selected bit line to a circuit, such as a sense amplifier, included in the I/O circuit 22. The I/O circuit 22 implements output of reading data or input of writing data.

The control logic 24 generates control signals in response to diverse control inputs (not shown), for example, a control signal output to the voltage generation circuit 26. The control signal output to the voltage generation circuit 26 will be described later.

The voltage generation circuit 26 is controlled by the control logic 24 and generates multiple voltages applied to the memory cell array 12.

B. Structure and Operations of Memory Cells

Figure 2:
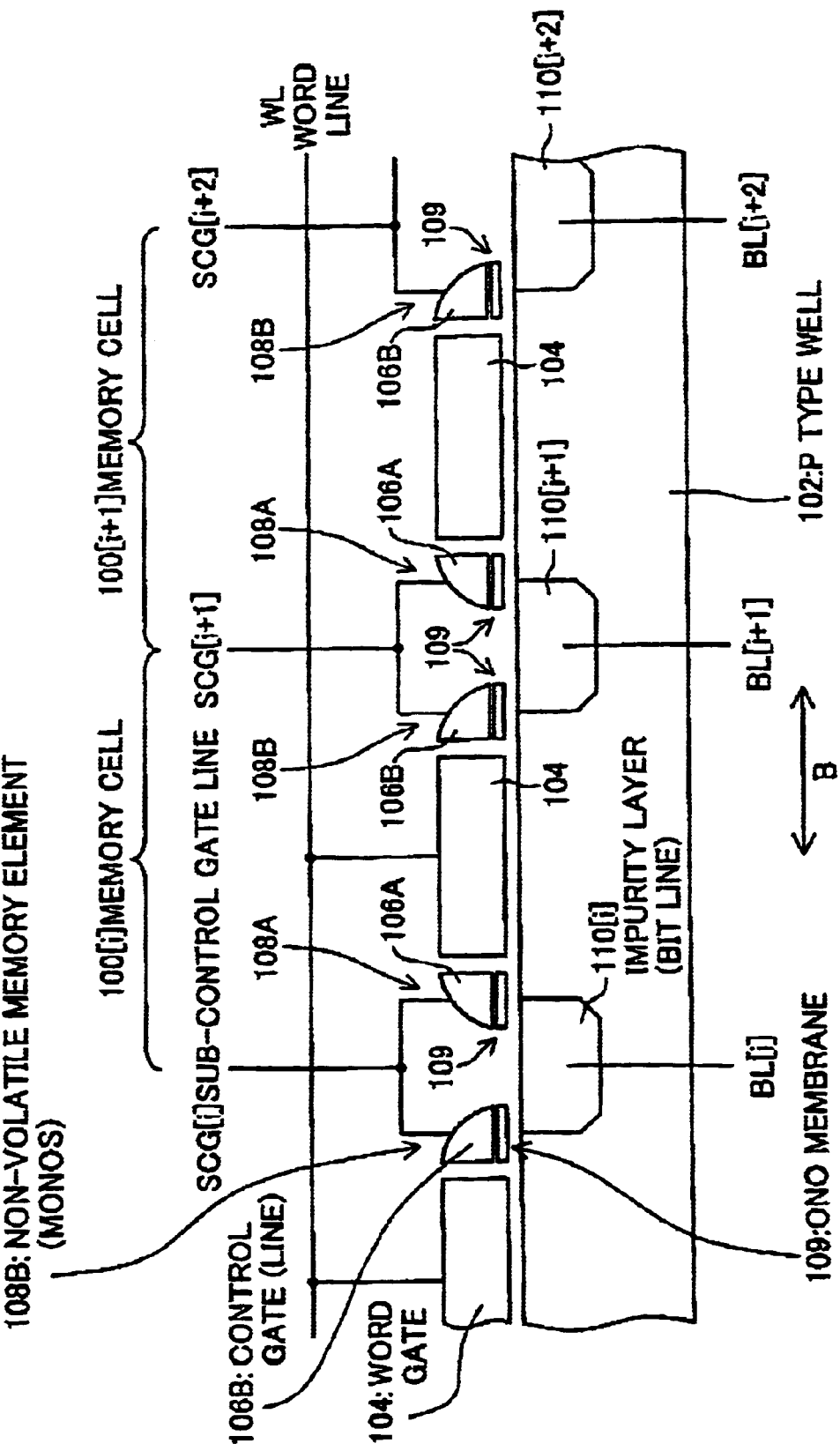
FIG. 2 is a sectional view schematically illustrating the structure of twin memory cells.

The following describes the structure and the operations of twin memory cells 100 used as the memory elements constituting the memory cell array 12. FIG. 2 is a sectional view schematically illustrating the structure of the twin memory cells 100.

Referring to FIG. 2, multiple twin memory cells 100 ( . . . , 100[i], 100[i+1], . . . : i is an integer of not less than 1) are arrayed in a direction B (hereafter referred to as a row direction or a word line direction) on a P type well 102. The twin memory cells 100 are also arrayed in multiple columns in a column direction (that is, a direction perpendicular to the sheet surface of FIG. 2: hereafter may also be referred to as a bit line direction). Namely the memory cell array 12 has the twin memory cells 100 arranged in a matrix.

Each twin memory cell 100 has a word gate 104 formed on the P type well 102 via a gate insulating film, a first memory element (MONOS memory element) 108A with a first control gate 106A, and a second memory element (MONOS memory element) 108B with a second control gate 106B.

Each of the first and the second memory elements 108A and 108B has an ONO membrane 109, which is a laminate of an oxide membrane (O), a nitride membrane (N), and an oxide membrane (O), on the P type well 102. The ONO membrane 109 traps electric charges. The first control gate 106A and the second control gate 106B are respectively formed on the ONO membranes 109 of the first and the second memory elements 108A and 108B. The working conditions of the first and the second MONOS memory elements 108A and 108B are controlled by the first and the second control gates 106A and 106B, which are composed of polysilicon corresponding to M (metal) of the MONOS. The first and the second control gates 106A and 106B may be composed of a conductive material, such as a silicide.

The word gate 104, which is composed of a material, for example, a polysilicon-containing material, is formed between the first and the second memory elements 108A and 108B to be electrically insulated from the first and the second memory elements 108A and 108B. Selection of the first and the second memory elements 108A and 108B of each twin memory cell 100 is determined in response to a voltage applied to the word gate 104.

As discussed above, each twin memory cell 100 has the first and the second MONOS memory elements 108A and 108B with split gates (that is, the first and the second control gates 106A and 106B). One word gate 104 is shared by the first and the second MONOS memory elements 108A and 108B.

The first and the second MONOS memory elements 108A and 108B independently function as trap sites of electric charges. Multiple word gates 104, which respectively control the trap of electric charges, are arrayed in the direction B (the row direction) at preset intervals as shown in FIG. 2, and are connected in common to one word line WL composed of, for example, polycide. Supply of a preset signal to the word line WL enables selection of at least one of the first and the second memory elements 108A and 108B in each of the twin memory cells 100 on an identical row.

Each of the control gates 106A and 106B is extended in the column direction and is shared by multiple twin memory cells 100 arranged on an identical column, so as to function as a control gate line. The control gates 106A and 106B, which are included in two different but adjacent twin memory cells 100 in the row direction and adjoin to each other, are connected in common to a sub-control gate line SCG ( . . . SCG[i], SCG[i+1], . . . ). The sub-control gate lines SCG are composed of a metal layer, which is an upper layer than the word gates 104, the control gates 106A and 106B, and the word lines WL. The two memory elements 108A and 108B in each twin memory cell 100 are controlled independently by independent application of voltages to the respective sub-control gate lines SCG, as discussed later.

An impurity layer 110 ( . . . , 110[i], 110[i+1], . . . ) is formed in the P type well 102 between each pair of adjoining memory elements 108A and 108B, which are included in two different but adjacent twin memory cells 100 in the row direction. Each of the impurity layers 110, for example, an n type impurity layer formed in the P type well 102, is extended in the column direction and is shared by multiple twin memory cells 100 arranged on an identical column, so as to function as a bit line BL ( . . . BL[i], BL[i+1]. . . ).

Application of a voltage to and detection of a current from the bit line BL enable charges (information) to be read and written (programmed) from and into one of the memory elements 108A and 108B in each twin memory cell 100 specified by the word line WL and the sub-control gate line SCG.

Figure 4:
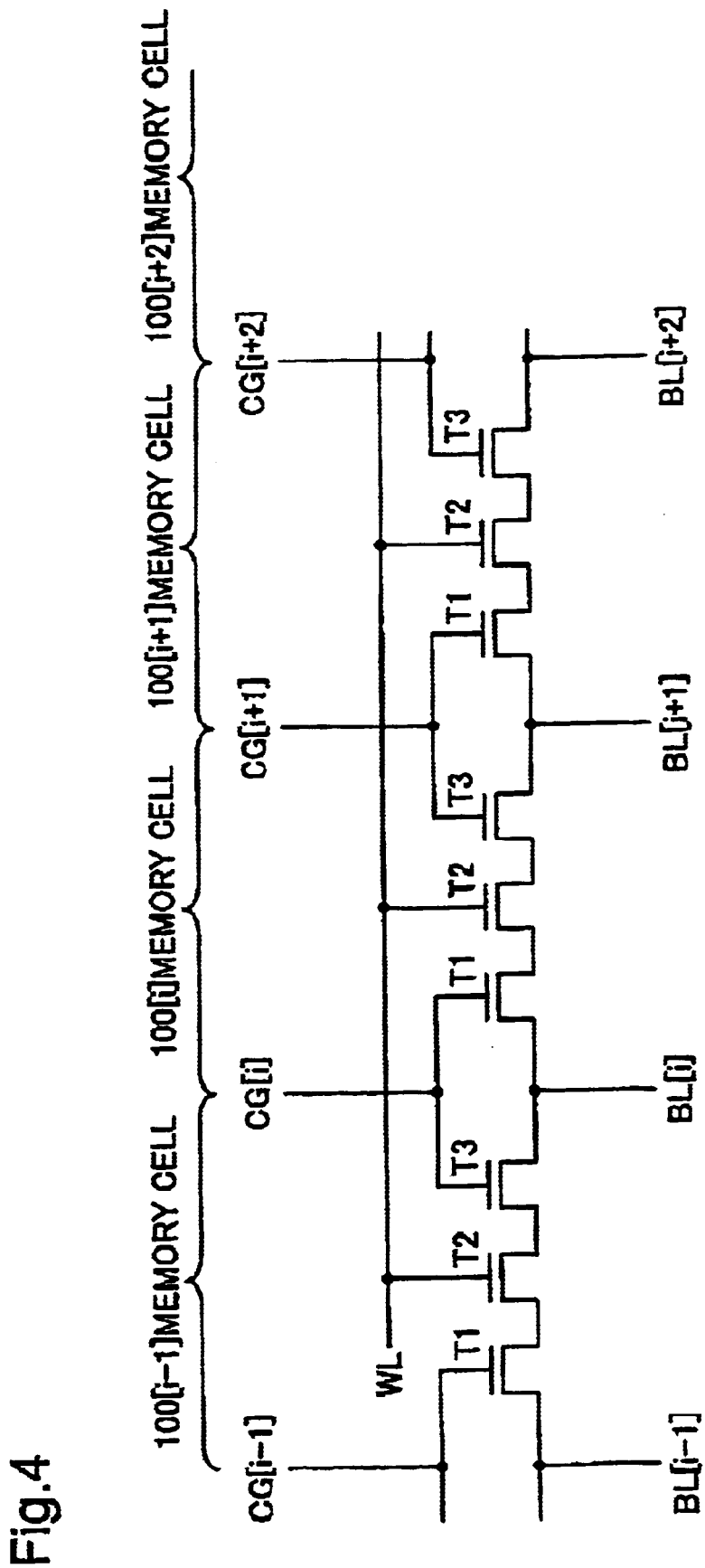
FIG. 4 is an equivalent circuit showing the structure of the twin memory cell.

The following describes a process of reading data from the memory element, a process of writing data into the memory element, and a process of erasing data from the memory element. FIG. 3 shows setting voltages in the data reading process from the memory element, in the data writing process into the memory element, and in the data erasing process from the memory element. In the following discussion, as shown in FIG. 4, one twin memory cell 100 is schematically expressed by a series connection of a transistor T2 driven by the word gate 104 and transistors T1 and T3 respectively driven by the first and the second control gates 106A and 106B.

B1. Data Reading Process

Figure 5:
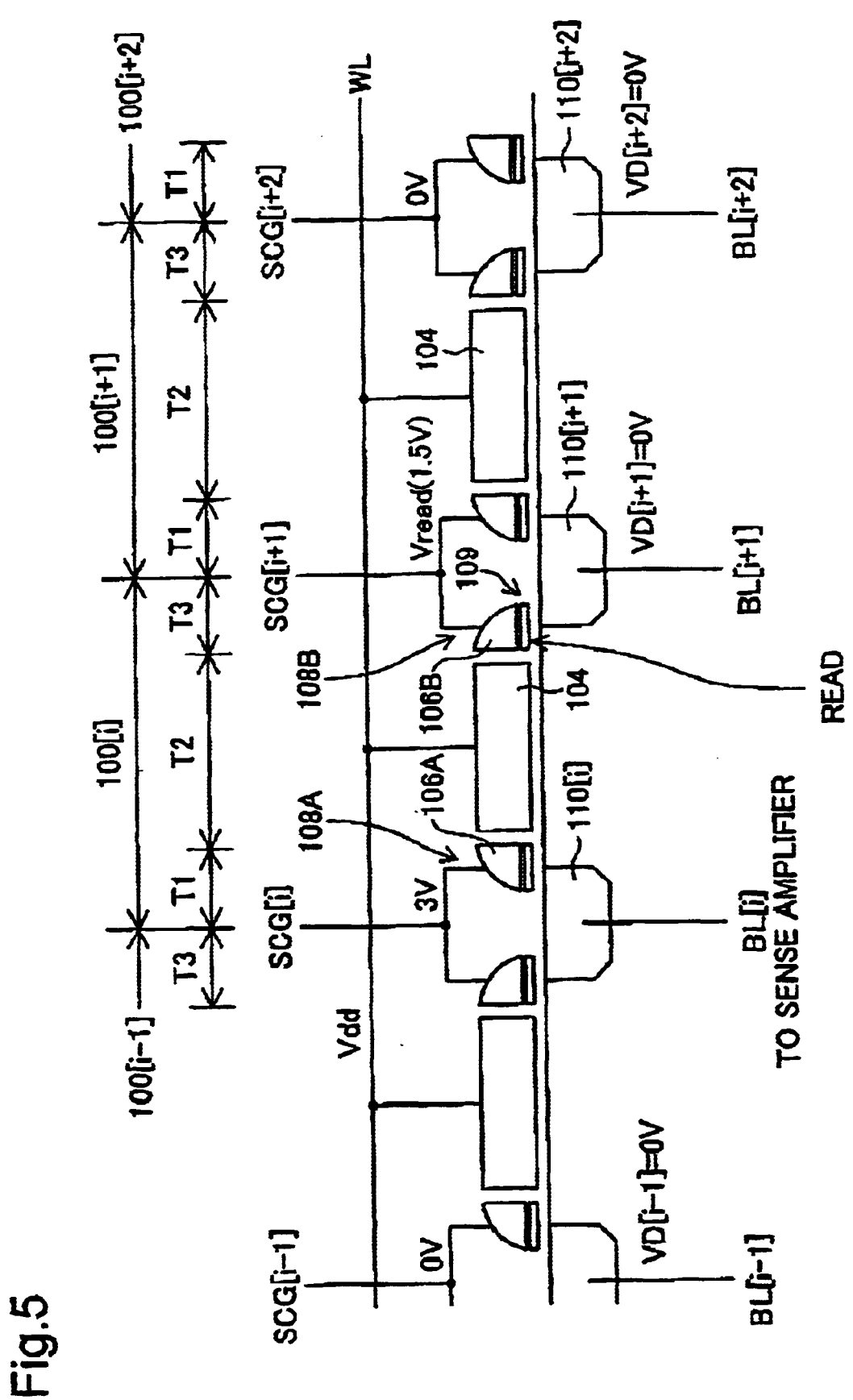
FIG. 5 schematically illustrates a data reading process from the twin memory cell shown in FIG. 2.

FIG. 5 schematically illustrates a data reading process from the twin memory cell 100 shown in FIG. 2. Potentials set at the respective positions in the process of FIG. 5 are on the assumption that a twin memory cell 100[i] connected to one word line WL is a selected cell, that a MONOS memory element 108B adjacent to the word gate 104 of the selected cells is a selected side, and that data is read from the selected memory element 108B in a reverse mode. Setting potentials at the respective positions are shown in FIG. 5 with regard to the selected twin memory cell 100[i] and non-selected twin memory cells 100[i−1], 100[i+1], and 100[i+2] adjoining to the selected cell. In the description below, the side opposite to the selected memory element out of the two memory elements included in the selected cell is referred to as a facing side, and the memory element 108A on the facing side is referred to as the opposite memory element.

A reading word line selection voltage Vdd (for example, 1.8 V) is applied to the word line WL, to which the word gate 104 of the selected twin memory cell 100[i] is connected. Application of the voltage turns ON all the transistors T2 in the respective twin memory cells 100 connected to this word line WL. A voltage 0 V is applied to the other non-selected word lines WL.

An override voltage (for example, 3 V) is applied to the control gate 106A on the facing side of the selected twin memory cell 100[i] via the sub-control gate line SCG[i]. A reading voltage Vread (for example, 1.5 V) is applied as a gate voltage VCG to the control gate 106B on the selected side of the twin memory cell 100[i].

The override voltage is required to turn ON the transistor (T1 in this example) corresponding to the opposite memory element, regardless of the presence or the absence of the program (that is, the presence or the absence of trapped electric charges) in the opposite memory element of the selected twin memory cell 100[i].

Application of the override voltage to the control gate 106A on the facing side turns ON the transistor T1 corresponding to the MONOS memory element 108A. The action of the transistor T3 corresponding to the MONOS memory element 108B depends upon the presence or the absence of accumulated electric charges in the selected MONOS memory element 108B.

Figure 6:
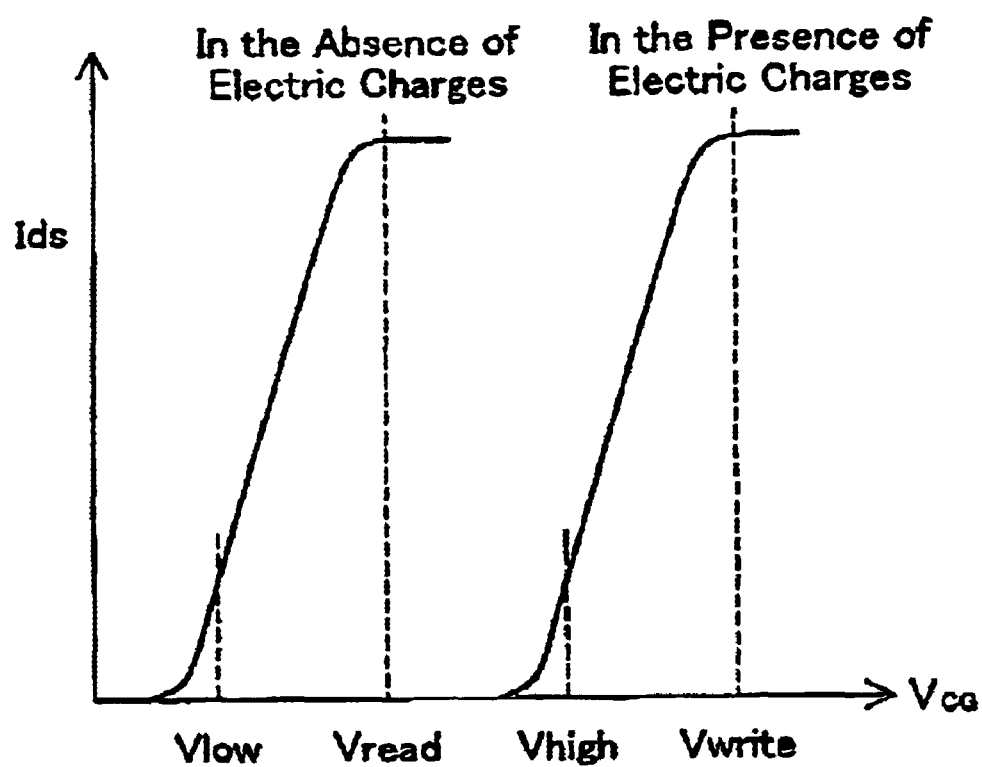
FIG. 6 is a graph showing variations in electric current Ids running between the source and the drain of a transistor corresponding to a selected memory element as ordinate, against gate voltage VCG applied to the control gate of the transistor as abscissa.

FIG. 6 is a graph showing variations in electric current Ids running between the source and the drain of the transistor corresponding to the selected memory element as ordinate, against the gate voltage VCG applied to the control gate on the selected side as abscissa.

As shown in FIG. 6, in the absence of accumulated electric charges in the selected MONOS memory element 108B, the electric current Ids starts running when the control gate voltage VCG on the selected side exceeds a lower threshold voltage Vlow. In the presence of accumulated electric charges in the selected MONOS memory element 108B, on the other hand, the electric current Ids does not start running until the control gate voltage VCG on the selected side exceeds a higher threshold voltage Vhigh.

The voltage Vread applied to the control gate 106B on the selected side in the course of reading data is set equal to a substantially medium value between the two threshold voltages Vlow and Vhigh. This is why the electric current Ids runs in the absence of accumulated electric charges in the selected MONOS memory element 108B but does not run in the presence of accumulated electric charges in the selected MONOS memory element 108B.

At the time of reading data, a sense amplifier (not shown) is connected to the bit line BL[i] (the impurity layer 110[i]) linked with the opposite memory element. A value '0' V is set to potentials VD[i−1], VD[i+1], and VD[i+2] of the other bit lines BL[i−1], BL[i+1], and BL[i+2]. In the absence of accumulated charges in the selected MONOS memory element 108B, supply of the electric current Ids causes an electric current of, for example, not less than 25 μA to run through the bit line BL[i] on the facing side via the transistors T1 and T2 in ON position. In the presence of accumulated charges in the selected MONOS memory element 108B, on the other hand, because of no supply of the electric current Ids, the electric current running through the bit line BL[i] connected to the opposite memory element is, for example, less than 10 nA even in the ON position of the transistors T1 and T2.

Detection of the electric current running through the bit line BL[i] on the facing side by the sense amplifier enables data to be read from the selected MONOS memory element 108B of the selected twin memory cell 100[i].

Each of the bit lines BL[i−1] to BL[i+2] is controlled to be activated or inactivated by a corresponding bit line selection transistor (not shown) included in the column selection circuit 20. A gate voltage BS of the bit line selection transistor corresponding to the bit line BL connected to the sense amplifier, that is, corresponding to the facing side, is set equal to 4.5 V as shown in the table of FIG. 3. The gate voltage BS of the bit line selection transistor corresponding to the selected side is set equal to the power source voltage Vdd.

The voltages shown in FIG. 3 are set in the non-selected memory cells.

B2. Data Writing Process

Figure 7:
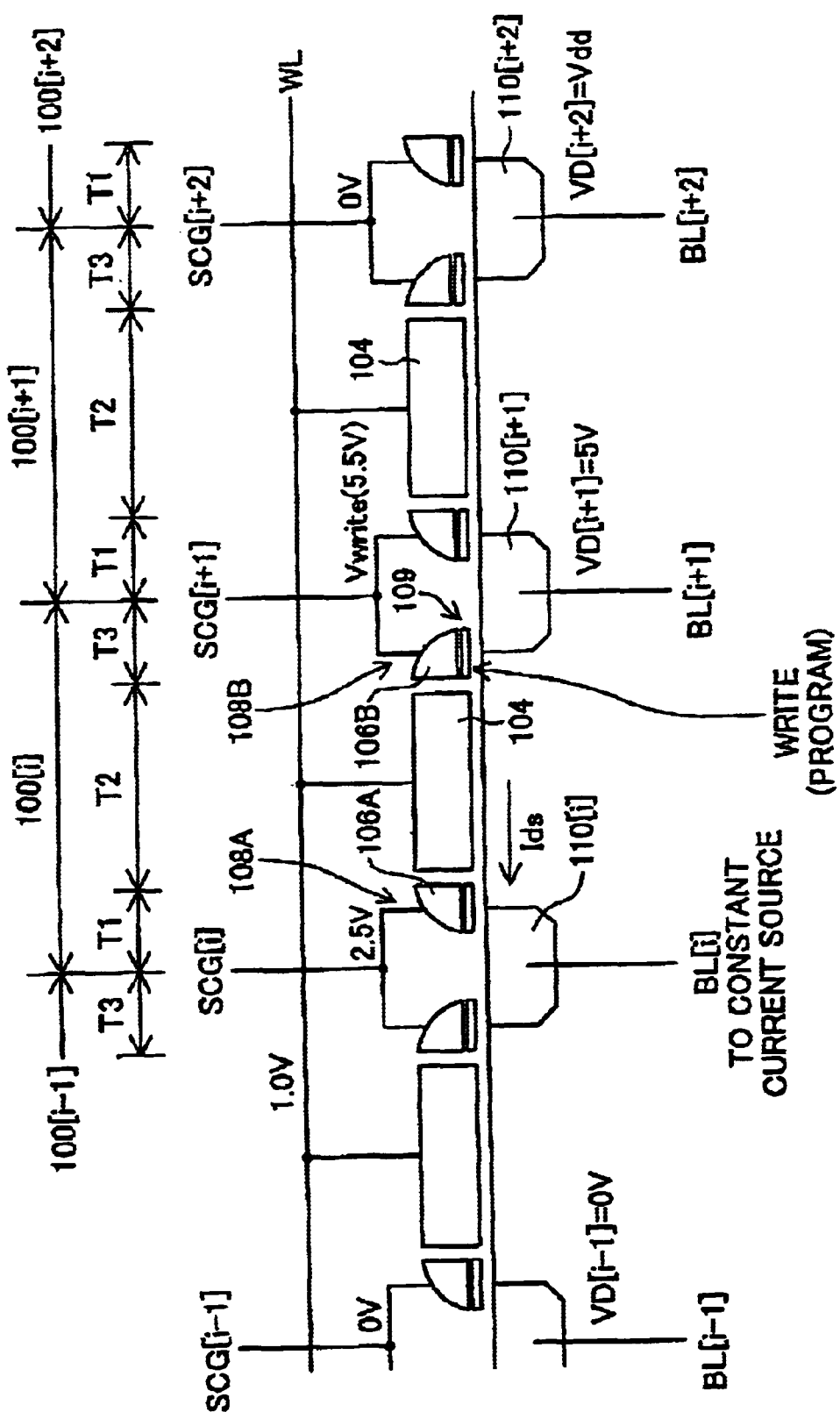
FIG. 7 schematically illustrates a data writing process into the twin memory cell shown in FIG. 2.

FIG. 7 schematically illustrates a data writing process into the twin memory cell 100 shown in FIG. 2. Potentials set at the respective positions in the process of FIG. 7 are on the assumption that the twin memory cell 100[i] connected to one word line WL is the selected cell, that the MONOS memory element 108B adjacent to the word gate 104 of the selected cells is the selected side, and that data is programmed or written into the selected memory element 108B. The data erasing process is carried out, prior to this data programming process.

Like the process of FIG. 5, in the process of FIG. 7, an override voltage (for example, 2.5 V) is set to the potential of the sub-control gate line SCG[i], and 0 V is set to the potentials of the sub-control gate lines SCG[i−1] and SCG[i+2].

A programming word line selection voltage of about 1.0 V, which is lower than the power source voltage Vdd, is set to the potential of the word gate 104 in the selected twin memory cell 100[i]. A writing voltage Vwrite (for example, 5.5 V), which is a programming control gate voltage, is applied to the control gate 106B of the selected memory element in the selected twin memory cell 100[i] via the sub-control gate line SCG[i+1].

The voltage VD[i+1] of the bit line BL[i+1] is set equal to a programming bit line voltage, for example, 5 V, while the power source voltage Vdd is set to the voltage VD[i+2] of the bit line BL[i+2]. An electric current from a constant current source (not shown) runs through the bit lines BL[i−1] and BL[i]. The MONOS cell connected to the bit line BL[i−1] is OFF, since the voltage of the sub-control gate line SCG[i−1] is equal to 0V. No electric current accordingly runs through this MONOS cell, and the voltage VD[i−1] of the bit line BL[i−1] is set equal to 0 V via the constant current source.

This setting turns ON both the transistors T1 and T2 in the selected twin memory cell 100[i] to make the electric current Ids run toward the bit line BL[i]. The ONO membrane 109 of the MONOS memory element 108B traps channel hot electrons (CHE). A programming process accordingly starts to write data '0' into the MONOS memory element 108B.

In the data writing process, the voltage 5.5 V is also applied to the control gate 106A of the non-volatile memory element 108A on the left of the non-selected twin memory cell 100[i+1]. The voltage applied to the control gate 106B on the right of the non-selected twin memory cell 100[i+1] is, however, equal to 0 V. No electric current accordingly runs between the source and the drain of the twin memory cell 100[i+1] (between the bit lines). Due to the applied voltage 5 V to the bit line BL[i+1], the presence of a high electric field between the source and the drain of the twin memory cell 100[i+1] (between the bit lines) generates a punch through electric current to cause a disturbance of writing.

The countermeasure against the disturbance of writing in this embodiment sets the power source voltage Vdd, instead of 0 V, to the voltage VD[i+2] of the bit line BL[i+2] so as to decrease the potential difference between the source and the drain. Another possible countermeasure against the disturbance of writing sets a voltage exceeding 0 V, preferably a voltage of not less than the programming word line selection voltage to the voltage VD[i+2] of the bit line BL[i+2] so as to interfere with the ON action of the transistor T2 of the twin memory cell 100[i+1].

Application of the voltage 5 V to the bit line BL[i+1] is required as discussed above. The gate voltage BS of a bit line selection transistor for selecting the bit line BL[i+1] is accordingly set equal to 8.0 V as shown in the table of FIG. 3. The voltage of not less than the power source voltage Vdd should be set to the voltage VD[i+2] of the bit line BL[i+2], because of the reason described above. The gate voltage BS of a bit line selection transistor (not shown) for selecting the bit line BL[i+2] is thus also set equal to 8 V.

The voltages shown in FIG. 3 are set in the non-selected memory cells.

B3. Data Erasing Process

Figure 8:
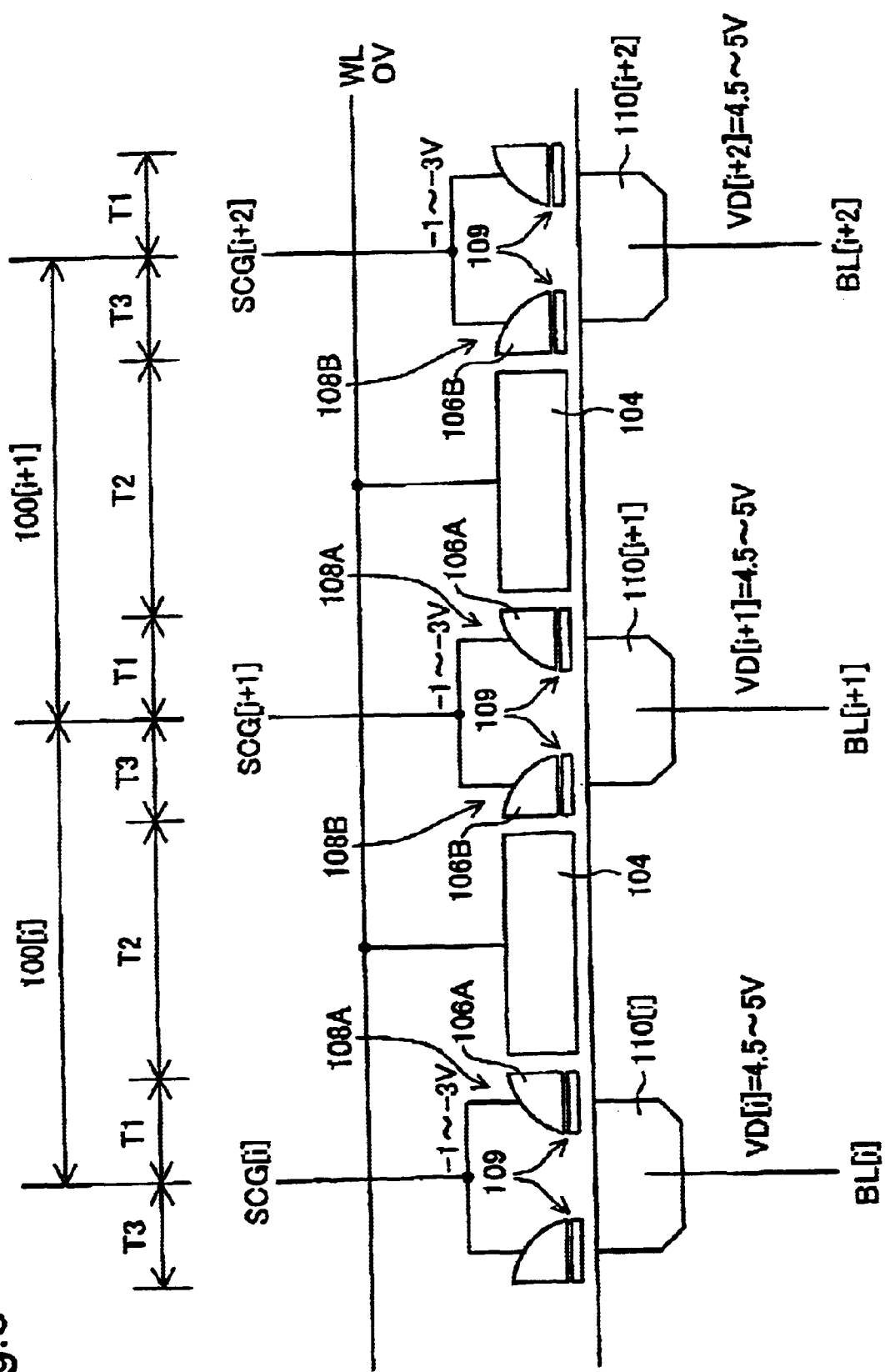
FIG. 8 schematically illustrates a data erasing process from the twin memory cell shown in FIG. 2.

FIG. 8 schematically illustrates a data erasing process from the twin memory cell 100 shown in FIG. 2. Potentials in FIG. 8 show the settings at the respective positions in the data erasing process.

As shown in FIG. 8, in the data erasing process, the potentials of the respective word gates 104 are set equal to 0 V by means of the word line WL, while the potentials of the control gates 106A and 106B are set equal to an erasing control gate voltage, for example, −1 to −3 V by means of the sub-control gate lines SCG[i], SCG[i+1], and SCG[i+2]. The potentials of the respective bit lines BL[i], BL[i+1], and BL[i+2] are set equal to an erasing bit line voltage, for example, 4.5 to 5 V via bit line selection transistors (not shown).

In this process, tunnel effects are exerted by an electric field formed by the erasing control gate voltage applied to the control gates and the erasing bit line voltage applied to the bit lines. The tunnel effects move out the electrons trapped by the ONO membranes 109 of the respective MONOS memory elements 108A and 108B. The data in the respective memory elements in the multiple twin memory cells are thus set equal to '1' simultaneously. Namely data are erased.

One modified process for erasing data forms hot holes by band-band tunneling effects on the surface of the impurity layers as bits to eliminate the trapped electrons.

As described above, the potentials shown in FIG. 3 are set in the word gates, the control gates, and the bit lines in the respective operation modes, that is, in the data reading process from the memory element, in the data writing process into the memory element, and in the data erasing process from the memory element.

C. Construction and Operations of Voltage Generation Circuit

Different voltage settings are required for the respective operation modes, that is, the data reading process from the memory element, the data writing process into the memory element, and the data erasing process from the memory element. The voltage generation circuit 26 accordingly generates various voltages required for the respective operation modes.

Figure 9:
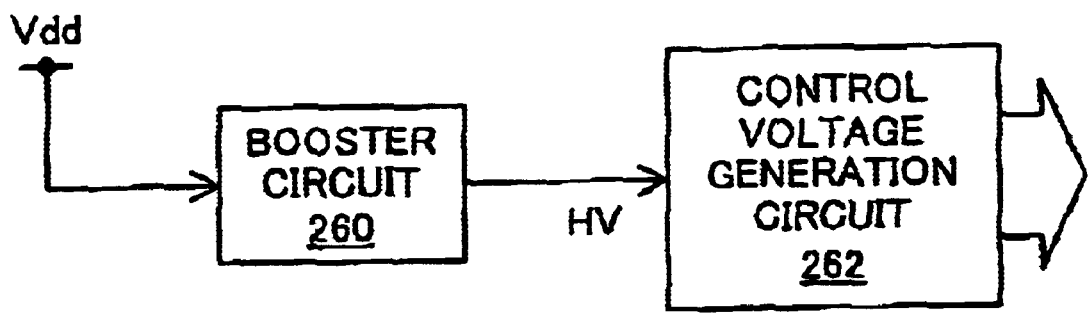
FIG. 9 is a block diagram showing the construction of a voltage generation circuit.

FIG. 9 is a block diagram showing the construction of the voltage generation circuit 26. The voltage generation circuit 26 includes a booster circuit 260 and a control voltage generation circuit 262.

The control voltage generation circuit 262 utilizes an output voltage HV from the booster circuit 260 to generate a plurality of different voltages required for the respective operation modes. Any of diverse general regulator circuits is applicable to the control voltage generation circuit 262.

The booster circuit 260 generates the boosted voltage HV from the power source voltage Vdd. As shown in the table of FIG. 3, the maximum voltage required in the data reading mode (Read mode) is 4.5 V. The maximum voltage required in the data writing (programming) mode (Program mode) and in the data erasing mode (Erase mode) is 8 V The booster circuit 260 accordingly generates a higher output voltage HV[high] equal to 8.0 V in the data writing mode and in the data erasing mode, while generating a lower output voltage HV[low] equal to 5.0 V in the data reading mode.

C1. Structure of Booster Circuit and Voltage Generation Process

Figure 10:
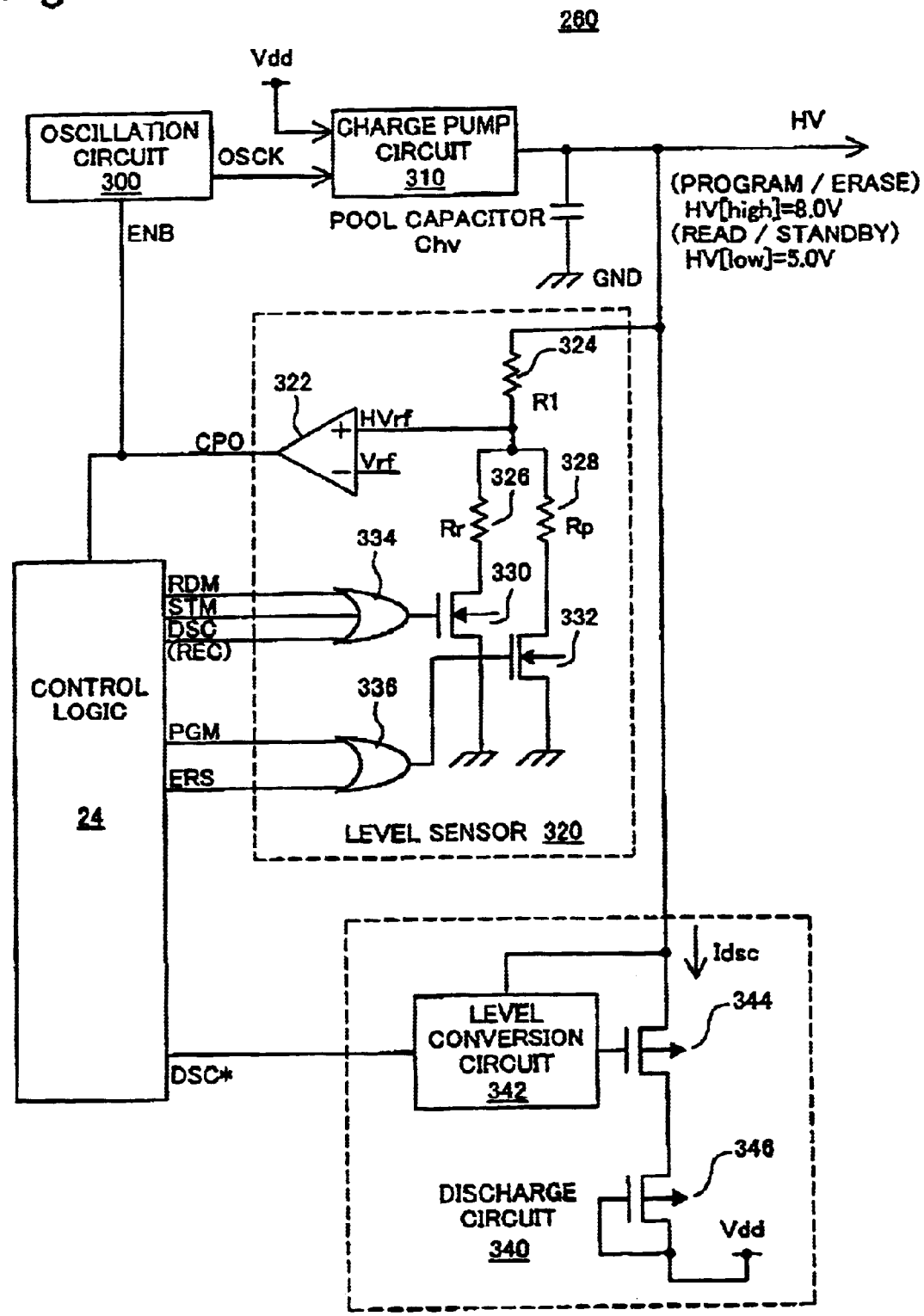
FIG. 10 shows the structure of a booster circuit included in the voltage generation circuit of FIG. 9.

FIG. 10 shows the structure of the booster circuit 260. The booster circuit 260 includes an oscillation circuit 300, a charge pump circuit 310, a level sensor 320, and a discharge circuit 340.

The booster circuit 260 generates a plurality of different voltages from one power source voltage Vdd. In this embodiment, the booster circuit 260 boosts the power source voltage Vdd of, for example, 1.8 V and generates the output voltage HV according to the operation mode of the memory cell array, that is, the output voltage HV of 5.0 V in a standby mode and in the data reading mode and the output voltage HV of 8.0 V in the data writing mode and in the data erasing mode. The standby mode represents a standby state without any access for data reading, data writing, or data erasing.

The charge pump circuit 310 works in response to a clock OSCK supplied from the oscillation circuit 300 and generates the output voltage HV obtained by boosting the power source voltage Vdd. A pool capacitor Chv is disposed between the output terminal of the charge pump circuit 310 and a reference potential point (GND). The pool capacitor Chv pools the output voltage HV from the charge pump circuit 310.

The level sensor 320 determines whether the output voltage HV from the charge pump circuit 310 is higher or lower than the relatively low voltage of 5.0 V in the standby mode and in the Read mode and is higher or lower than the relatively high voltage of 8.0 V in the Program mode or in the Erase mode, in response to a read signal RDM, a standby signal STM, a programming signal PGM, and an erasing signal ERS supplied from the control logic 24. The level sensor 320 then feeds back a level detection signal CPO representing the result of the determination as an enable signal ENB to the oscillation circuit 300.

The oscillation circuit 300 outputs the clock signal OSCK to the charge pump circuit 310 in response to the level detection signal CPO transmitted as the enable signal ENB from the level sensor 320. When the output voltage HV from the charge pump circuit 310 is higher than 5.0 V in the standby mode or in the Read mode, the detection signal CPO as the enable signal ENB is inactive (at the low level in this embodiment) to prohibit the oscillation operation of the oscillation circuit 300. When the output voltage HV is lower than 5.0 V in the standby mode or in the Read mode, on the other hand, the detection signal CPO is active (at the higher level in this embodiment) to start the oscillation operation of the oscillation circuit 300. In the Program mode or in the Erase mode, when the output voltage HV is higher than 8.0 V, the detection signal CPO is inactive (at the low level in this embodiment) to prohibit the oscillation operation of the oscillation circuit 300. When the output voltage HV is lower than 8.0 V, on the other hand, the detection signal CPO is active (at the high level in this embodiment) to start the oscillation operation of the oscillation circuit 300.

The level sensor 320 has a comparator 322. A reference voltage Vrf is input into a negative input terminal (−) of the comparator 322, whereas a detection voltage HVrf, which is part of the output voltage HV, is input into a positive input terminal (+) of the comparator 322.

The detection voltage HVrf is obtained by dividing the output voltage HV by a first voltage division circuit including a first resistor 324, a second resistor 326, and a first transistor 330 connected thereto in series or by a second voltage division circuit including the first resistor 324, a third resistor 328, and a second transistor 332 connected thereto in series.

The output of an OR circuit 334 is connected to a gate input terminal of the first transistor 330. The read signal RDM representing the Read mode, the standby signal STM representing the standby mode, and a discharge signal DSC corresponding to a recovery mode (discussed later) are connected to an input terminal of the OR circuit 334. The first transistor 330 functions as a switch that is turned ON when any one of the read signal RDM, the standby signal STM, and the discharge signal DSC is active (at the high level in this embodiment). Similarly, the output of an OR circuit 336 is connected to a gate input terminal of the second transistor 332. The programming signal PGM representing the Program mode and the erasing signal ERS representing the Erase mode are connected to an input terminal of the OR circuit 336. The second transistor 332 functions as a switch that is turned ON when either one of the programming signal PGM and the erasing signal ERS is active (at the high level in this embodiment).

When the read signal RDM or the standby signal STM is active (at the high level) to turn the first transistor 330 ON, the output voltage HV is divided by means of the first resistor 324 and the second resistor 326 and is input into the comparator 322 as the detection voltage HVrf. When the programming signal PGM or the erasing signal ERS is active (at the high level) to turn the second transistor 332 ON, on the other hand, the output voltage HV is divided by means of the first resistor 324 and the third resistor 328 and is input into the comparator 322 as the detection voltage HVrf.

The feedback circuit consisting of the oscillation circuit 300, the charge pump circuit 310, and the level sensor 320 works to make the detection voltage HVrf equal to the reference voltage Vrf.

Equations (1) and (2) given below are held on the assumption that the ON resistances of the first and the second transistors 330 and 332 are negligible:

$$HV[low]=Vrf.(1+R1/Rr) \quad (1)$$

$$HV[high]=Vrf.(1+R1/Rp) \quad (2)$$

Here R1, Rr, and Rp respectively denote resistances of the first through the third resistors 324, 326, and 328.

As clearly understood from Equations (1) and (2) given above, the lower output voltage HV[low] for turning the first transistor 330 ON and the higher output voltage HV[high] for turning the second transistor 332 ON are independently set by regulating the resistances R1, Rr, and Rp of the first through the third resistors 324, 326, and 328. In this embodiment, according to the voltage setting conditions shown in the table of FIG. 3, the lower output voltage HV[low] to turn the first transistor 330 ON is set equal to 5.0 V in the Read mode and in the standby mode. In the Program mode and in the Erase mode, the higher output voltage HV[high] to turn the second transistor 332 ON is set equal to 8.0 V.

As described above, in the booster circuit 260, the oscillation operation of the oscillation circuit 300 and the operation of the charge pump circuit 310 are controlled according to the level of the output voltage HV detected by the level sensor 320. The booster circuit 260 functions to make the output voltage HV from the charge pump circuit 310 equal to the lower output voltage HV[low] of 5.0 V in the standby mode and in the Read mode and equal to the higher output voltage HV[high] of 8.0 V in the Program mode and in the Erase mode.

C2. Voltage Switchover Process

When the operation in the Program mode or in the Erase mode is concluded and the operation in the Read mode is resumed, the output voltage HV is switched over from the higher output voltage HV[high] equal to 8.0 V to the lower output voltage HV[low] equal to 5.0 V.

There are capacitors parasitic on the wiring of the output voltage HV, in addition to the pool capacitor Chv. For switchover from the state of the higher output voltage HV[high] to the state of the lower output voltage HV[low], it is required to discharge electric charges accumulated in these capacitors. Spontaneous discharge (for example, a leak current of a transistor connected to the wiring of the output voltage HV) in the circuit and a discharge current via the voltage division circuits of the first through the third resistors 324, 326, and 328 have only small quantities. A relatively long time period is thus required for enabling the reading operation (recovery time). Reduction of this recovery time is demanded.

In the booster circuit 260, in the voltage switchover process, the discharge circuit 340 is actuated to forcibly discharge the electric charges in the state of the higher output voltage HV[high] and restore the state of the lower output voltage HV[low] at a high speed.

As shown in FIG. 10, the discharge circuit 340 includes a transistor 344, a transistor 346, and a level conversion circuit 342. The transistor 344 functions as a switch that is ON for a time period of active state (low level in this embodiment) of an inversion signal DSC* (hereafter referred to as the inverse discharge signal) of the discharge signal DSC (recovery signal REC) supplied from the control logic 24. The transistor 346 functions as a load for specifying the value of a discharge current Idsc. The level conversion circuit 342 converts the level of the inverse discharge signal DSC* to a suitable signal level as a gate input into the transistor 344.

FIGS. 11(a) through 11(f) are a timing chart showing the switchover operation of the output voltage HV. FIG. 11(a) shows the output voltage HV from the charge pump circuit 310. While the program signal PGM is in the active state (at the high level) as shown in FIG. 11(b), the second transistor 332 of the level sensor 320 is ON to set the output voltage HV equal to the higher output voltage HV[high] of 8.0 V. At this moment, the detection signal CPO of the level sensor 320 is changed to the active state (the high level) or to the inactive state (the low level) with a variation in level of the output voltage HV.

When the program signal PGM falls into the inactive state (the low level) to conclude the Program mode, the recovery signal REC representing the recovery time rises to the active state (the high level) as shown in FIG. 11(d). The recovery signal REC is practically equivalent to the discharge signal DSC.

The active state of the inverse discharge signal DSC* drives the discharge circuit 340 to generate the discharge current Idsc. This makes the electric charges accumulated in the capacitors including the pool capacitor Chv forcibly discharged. The output voltage HV is abruptly lowered from the higher output voltage HV[high] of 8.0 V with a decrease in accumulated electric charges as shown in FIG. 11(a).

While the discharge signal DSC is in the active state (at the high level), the first transistor 330 of the level sensor 320 is ON. The level sensor 320 accordingly functions as a detection circuit of the low output voltage HV[low] equal to 5.0 V. While the output voltage HV is higher than 5.0 V, the detection signal CPO output from the comparator 322 is kept in the inactive state (at the low level) as shown in FIG. 11(e) to stop the boosting operation by the oscillation circuit 300 and the charge pump circuit 310. In this state, only the discharge operation by the discharge circuit 340 is carried out. The output voltage HV is thus abruptly lowered at a speed corresponding to the magnitude of the discharge current Idsc.

When the output voltage HV becomes less than the lower output voltage HV[low] of 5.0 V, the detection signal CPO output from the level sensor 320 is changed to the active state (the high level). A recovery end signal RECEND then rises to the active state (the high level) as shown in FIG. 11(f). This makes the recover signal REC fall into the inactive state (the low level) to conclude the recovery time. In response to the inactive state of the recovery signal REC to end the recovery time, the inverse discharge signal DSC* is changed to the inactive state (the high level) to stop the discharge circuit 340 and conclude the discharge operation. The recovery end signal RECEND falls into the inactive state (the low level) with the change of the recovery signal REC to the inactive state (the low level). When the recovery time (the time period when the recovery signal REC is in the active state) ends to conclude the discharge operation of the accumulated electric charges, the booster circuit 260 resumes the normal operation to make the output voltage HV equal to the lower output voltage HV[low] of 5.0 V.

As described above, the discharge circuit 340 in the booster circuit 260 is actuated on conclusion of the Program mode to quickly restore the output voltage HV from the higher output voltage HV[high] of 8.0 V in the Program mode to the lower output voltage HV[low] of 5.0 V in the Read mode. The level sensor 320 for regulating the level of the output voltage HV at a constant value is also used as the detection sensor for detecting the end of the recovery time required for the restoration. This arrangement desirably simplifies the structure of the booster circuit 260. The non-volatile semiconductor memory device 10 of the embodiment does not require any separate detection sensor for detecting the end timing of the discharge operation. This effectively decreases the required space of the booster circuit 260 and reduces the manufacturing cost.

The above description regards the switchover from the Program mode to the Read mode. The similar series of operations is executed at the time of a switchover from the Erase mode to the Read mode, that is, at the time of any switchover from the state of the relatively high output voltage HV[high] to the state of the relatively low output voltage HV[low].

In the structure of the booster circuit 260 shown in FIG. 10 and the timing chart of the switchover operation shown in FIG. 11, the active state of each signal is at the high level and the inactive state is at the low level, except the inverse discharge signal DSC*. This is, however, not restrictive, but any combination is allowable according to the circuit structure.

The control voltage generation circuit 262 and the control logic 24 correspond to the working voltage generation circuit and the control circuit of the present invention, respectively.

D. Modifications

The above embodiment is to be considered in all aspects as illustrative and not restrictive. There may be many modifications, changes, and alterations without departing from the scope or spirit of the main characteristics of the present invention.

For example, the non-volatile memory elements 108A and 108B are not restricted to the MONOS structure. The technique of the present invention is applicable to non-volatile semiconductor memory devices using a diversity of other twin memory cells that include one word gate and first and second control gates to trap electric charges independently at two different positions.

The scope and spirit of the present invention are indicated by the appended claims, rather than by the foregoing description.

What is claimed is:

1. A non-volatile semiconductor memory device having a memory cell array of multiple non-volatile memory elements, the non-volatile semiconductor memory device comprising:

a booster circuit that generates a boosted voltage from a power source voltage according to each of diverse operation modes in the non-volatile semiconductor memory device;

a working voltage generation circuit that generates a working voltage to make a predetermined non-volatile memory element in the memory cell array carry out an operation according to each of the diverse operation modes; and a control circuit that controls operations of at least the working voltage generation circuit and the booster circuit according to each of the diverse operation modes, the booster circuit comprising:

a charge pump circuit that boosts the power source voltage and generates a boosted output voltage;

an oscillation circuit that outputs a clock signal to control operation of the charge pump circuit;

a level sense circuit that is set a first setting voltage in a first operation mode out of the diverse operation modes and a second setting voltage, which is lower than the first setting voltage, in a second operation mode by the control circuit, and controls operation of the oscillation circuit to make the output voltage of the charge pump circuit equal to the setting voltage; and a discharge circuit that is driven at a time of switchover from the first operation mode to the second operation mode to lower the level of the output voltage of the charge pump circuit, wherein the level sense circuit detects a change of the output voltage of the charge pump circuit to the second setting voltage after the switchover from the first operation mode to the second operation mode, so as to detect an end timing of the operation of the discharge circuit, and the control circuit stops the operation of the discharge circuit based on a result of detection of the end timing.

2. A non-volatile semiconductor memory device in accordance with claim 1, wherein each of the non-volatile memory elements comprises a twin memory cell controlled by one word gate and two control gates.

3. A non-volatile semiconductor memory device in accordance with claim 2, wherein each of the non-volatile memory elements has an ONO membrane including an oxide film (O), a nitride film (N), and an oxide film (O) as a trap side of electric charges.

4. A non-volatile semiconductor memory device in accordance with claim 1, wherein each of the non-volatile memory elements has an ONO membrane including an oxide film (O), a nitride film (N), and an oxide film (O) as a trap side of electric charges.

* * * * *